United States Patent
Hathaway

(10) Patent No.: US 6,210,484 B1
(45) Date of Patent: *Apr. 3, 2001

(54) HEATING DEVICE CONTAINING A MULTI-LAMP CONE FOR HEATING SEMICONDUCTOR WAFERS

(75) Inventor: Kevin Hathaway, Palo Alto, CA (US)

(73) Assignee: Steag RTP Systems, Inc., San Jose, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/150,280

(22) Filed: Sep. 9, 1998

(51) Int. Cl.[7] ............... C23C 16/00; F27B 9/04
(52) U.S. Cl. ............................. 118/724; 219/390
(58) Field of Search .................... 118/724, 728, 118/715, 725; 156/345; 219/422, 410, 411, 413, 405; 392/416, 411, 418, 422, 425, 427, 428; 438/65, 66

(56) References Cited

U.S. PATENT DOCUMENTS

| 2,057,776 | 10/1936 | Groven . |
| 2,318,553 | 5/1943 | Selvig . |
| 3,623,712 | 11/1971 | McNeilly et al. . |
| 3,761,678 | 9/1973 | Eckles . |
| 3,796,182 | 3/1974 | Rosler . |

(List continued on next page.)

FOREIGN PATENT DOCUMENTS

| 0308388A1 | 3/1989 | (EP) . |
| 0468874A2 | 1/1992 | (EP) . |
| 0505928A2 | 3/1992 | (EP) . |
| 21809898 | 5/1989 | (GB) . |
| 58-24788 | 2/1983 | (JP) . |
| 59-17253 | 1/1984 | (JP) . |
| 60-727 | 1/1985 | (JP) . |
| 60-253939 | 12/1985 | (JP) . |
| 60-258915 | 12/1985 | (JP) . |
| 60-258928 | 12/1985 | (JP) . |
| 61-196515 | 8/1986 | (JP) . |
| 61-199631 | 9/1986 | (JP) . |
| 62-20308 | 1/1987 | (JP) . |
| 62-33418 | 2/1987 | (JP) . |
| 62-46516 | 2/1987 | (JP) . |
| 63-39930 | 3/1988 | (JP) . |
| 63-143814 | 6/1988 | (JP) . |
| 63-149524 | 10/1988 | (JP) . |
| 63-260127 | 10/1988 | (JP) . |
| 63-263719 | 10/1988 | (JP) . |
| 63-269515 | 11/1988 | (JP) . |
| 64-11324 | 1/1989 | (JP) . |
| 64-90525 | 4/1989 | (JP) . |
| 1-204114 | 8/1989 | (JP) . |
| 1-239428 | 9/1989 | (JP) . |
| 5259082 | 10/1993 | (JP) . |

OTHER PUBLICATIONS

PCT Search Report; Int'l Appl. No. PCT/IB 99/01710; Mar. 8, 2000.

*Primary Examiner*—Gregory Mills
*Assistant Examiner*—P. Hassonzadeh
(74) *Attorney, Agent, or Firm*—Dority & Manning, P.A.

(57) ABSTRACT

An apparatus for heat treating semiconductor wafers is disclosed. The apparatus includes a heating device which contains an assembly of light energy sources for emitting light energy onto a wafer. In particular, the present invention is directed to a heating device that contains at least one heating cone. The heating cone of the present invention includes a circular reflector that can be conically-shaped. A plurality of light energy sources are contained within the reflector. The light energy sources can be vertically oriented or can be tilted slightly towards the central axis of the heating cone. In this arrangement, it has been discovered that the heating cone produces a uniform irradiance distribution over a wafer being heated.

34 Claims, 5 Drawing Sheets

U.S. PATENT DOCUMENTS

| | | |
|---|---|---|
| 3,830,194 | 8/1974 | Benzing et al. . |
| 3,836,751 | 9/1974 | Anderson . |
| 3,862,397 | 1/1975 | Anderson et al. . |
| 3,936,686 | 2/1976 | Moore . |
| 4,001,047 | 1/1977 | Boah . |
| 4,041,278 | 8/1977 | Boah . |
| 4,047,496 | 9/1977 | McNeilly et al. . |
| 4,048,955 | 9/1977 | Anderson . |
| 4,081,313 | 3/1978 | McNeilly et al. . |
| 4,097,226 | 6/1978 | Erikson et al. . |
| 4,101,759 | 7/1978 | Anthony et al. . |
| 4,115,163 | 9/1978 | Gorina et al. . |
| 4,184,065 | 1/1980 | Nagashima . |
| 4,221,956 | 9/1980 | Fielding et al. . |
| 4,224,504 | 9/1980 | Erikson et al. . |
| 4,232,360 | 11/1980 | Vakil et al. . |
| 4,270,260 | 6/1981 | Krueger . |
| 4,378,956 | 4/1983 | Lester . |
| 4,389,970 | 6/1983 | Edgerton . |
| 4,411,619 | 10/1983 | Darnell et al. . |
| 4,436,985 | 3/1984 | Weber . |
| 4,442,338 | 4/1984 | Yamazaki . |
| 4,446,817 | 5/1984 | Crawley . |
| 4,448,000 | 5/1984 | Manuccia et al. . |
| 4,470,369 | 9/1984 | Edgerton . |
| 4,477,718 | 10/1984 | Crain et al. . |
| 4,489,234 | 12/1984 | Harnden, Jr. et al. . |
| 4,496,828 | 1/1985 | Kusmierz et al. . |
| 4,504,323 | 3/1985 | Arai et al. . |
| 4,504,730 | 3/1985 | Shimizu . |
| 4,508,960 | 4/1985 | Arai . |
| 4,510,555 | 4/1985 | Mori . |
| 4,511,788 | 4/1985 | Arai et al. . |
| 4,517,448 | 5/1985 | Crain et al. . |
| 4,533,820 | 8/1985 | Shimizu . |
| 4,540,876 | 9/1985 | McGinty . |
| 4,543,472 | 9/1985 | Arai et al. . |
| 4,544,418 | 10/1985 | Gibbons . |
| 4,545,327 | 10/1985 | Campbell et al. . |
| 4,550,245 | 10/1985 | Arai et al. . |
| 4,550,684 | 11/1985 | Mahawili . |
| 4,551,616 | 11/1985 | Buttery . |
| 4,558,660 | 12/1985 | Nishizawa et al. . |
| 4,567,352 | 1/1986 | Mimura et al. . |
| 4,571,486 | 2/1986 | Arai et al. . |
| 4,581,520 | 4/1986 | Vu et al. . |
| 4,607,591 | 8/1986 | Stitz . |
| 4,615,294 | 10/1986 | Scapple et al. . |
| 4,632,056 | 12/1986 | Stitz et al. . |
| 4,632,057 | 12/1986 | Price et al. . |
| 4,640,224 | 2/1987 | Bunch et al. . |
| 4,642,243 | 2/1987 | Yamazaki . |
| 4,649,261 | 3/1987 | Sheets . |
| 4,653,428 | 3/1987 | Wilson et al. . |
| 4,654,509 | 3/1987 | Robinson et al. . |
| 4,680,447 | 7/1987 | Mahwili . |
| 4,680,451 | 7/1987 | Gat et al. . |
| 4,694,143 | 9/1987 | Nishimura et al. . |
| 4,698,486 | 10/1987 | Sheets . |
| 4,755,654 | 7/1988 | Crowley et al. . |
| 4,761,538 | 8/1988 | Chiba et al. . |
| 4,789,771 | 12/1988 | Robinson et al. . |
| 4,796,562 | 1/1989 | Brors et al. . |
| 4,806,321 | 2/1989 | Nishizawa et al. . |
| 4,817,558 | 4/1989 | Itoh . |
| 4,820,377 | 4/1989 | Davis et al. . |
| 4,820,906 | 4/1989 | Stultz . |
| 4,830,700 | 5/1989 | Davis et al. . |
| 4,832,777 | 5/1989 | Davis et al. . |
| 4,832,778 | 5/1989 | Davis et al. . |
| 4,832,779 | 5/1989 | Fisher et al. . |
| 4,836,138 | 6/1989 | Robinson et al. . |
| 4,854,263 | 8/1989 | Chang et al. . |
| 4,857,139 | 8/1989 | Tashiro et al. . |
| 4,857,704 | 8/1989 | Jannot et al. . |
| 4,859,832 | 8/1989 | Uehara et al. . |
| 4,886,954 | 12/1989 | Yu et al. . |
| 4,901,670 | 2/1990 | Ahlgren . |
| 4,908,495 | 3/1990 | Ishii et al. . |
| 4,911,103 | 3/1990 | Davis et al. . |
| 4,913,929 | 4/1990 | Moslehi et al. . |
| 4,914,276 | 4/1990 | Blair . |
| 4,919,077 | 4/1990 | Oda et al. . |
| 4,920,918 | 5/1990 | Adams et al. . |
| 4,924,073 | 5/1990 | Chiba . |
| 4,924,807 | 5/1990 | Nakayama et al. . |
| 4,956,538 | 9/1990 | Moslehi . |
| 4,958,061 | 9/1990 | Wakabayashi et al. . |
| 4,975,561 | 12/1990 | Robinson et al. . |
| 4,979,466 | 12/1990 | Nishitani et al. . |
| 4,981,815 | 1/1991 | Kakoschke . |
| 4,985,281 | 1/1991 | Ahlgren . |
| 4,989,544 | 2/1991 | Yoshikawa . |
| 5,000,113 | 3/1991 | Wang et al. . |
| 5,011,794 | 4/1991 | Grim et al. . |
| 5,033,407 | 7/1991 | Mizuno et al. . |
| 5,038,395 | 8/1991 | Lenski . |
| 5,044,943 | 9/1991 | Bowman et al. . |
| 5,047,611 | 9/1991 | Stultz . |
| 5,053,247 | 10/1991 | Moore . |
| 5,057,668 | 10/1991 | Gisdakis et al. . |
| 5,073,698 | 12/1991 | Stultz . |
| 5,085,887 | 2/1992 | Adams et al. . |
| 5,108,792 | 4/1992 | Anderson et al. . |
| 5,113,929 | 5/1992 | Nakagawa et al. . |
| 5,129,360 | 7/1992 | Ahern et al. . |
| 5,148,714 | 9/1992 | Mcdiarmid . |
| 5,154,512 | 10/1992 | Schietinger et al. . |
| 5,155,337 | 10/1992 | Sorrell et al. . |
| 5,156,820 | 10/1992 | Wong et al. . |
| 5,160,545 | 11/1992 | Maloney et al. . |
| 5,179,677 | 1/1993 | Anderson et al. . |
| 5,188,058 | 2/1993 | Nakai . |
| 5,194,401 | 3/1993 | Adams et al. . |
| 5,207,835 | 5/1993 | Moore . |
| 5,215,588 | 6/1993 | Rhieu . |
| 5,244,501 | 9/1993 | Nakayama et al. . |
| 5,252,132 | 10/1993 | Oda et al. . |
| 5,252,366 | 10/1993 | Ahern et al. . |
| 5,253,324 | * 10/1993 | Wortman et al. .................... 392/416 |
| 5,259,881 | 11/1993 | Edwards et al. . |
| 5,268,989 | 12/1993 | Moslehi et al. . |
| 5,269,847 | 12/1993 | Anderson et al. . |
| 5,271,084 | 12/1993 | Vendenabeele et al. . |
| 5,275,629 | 1/1994 | Ajika et al. . |
| 5,288,364 | 2/1994 | Burt et al. . |
| 5,305,417 | 4/1994 | Najm et al. . |
| 5,308,161 | 5/1994 | Stein . |
| 5,314,538 | 5/1994 | Maeda et al. . |
| 5,315,092 | 5/1994 | Takahashi et al. . |
| 5,317,492 | 5/1994 | Gronet et al. . |
| 5,322,567 | 6/1994 | Deaton et al. . |
| 5,332,442 | 7/1994 | Kubodera et al. . |
| 5,332,883 | 7/1994 | Higashira . |
| 5,345,534 | 9/1994 | Najm et al. . |
| 5,348,587 | 9/1994 | Eichman et al. . |
| 5,364,667 | 11/1994 | Rhieu . |
| 5,366,554 | 11/1994 | Kanai et al. . |
| 5,367,606 | 11/1994 | Moslehi et al. . |
| 5,372,648 | 12/1994 | Yamomoto et al. . |
| 5,380,682 | 1/1995 | Edwards et al. . |

| | | |
|---|---|---|
| 5,399,523 | 3/1995 | Kakoschke . |
| 5,414,244 | 5/1995 | Imahashi . |
| 5,418,885 | 5/1995 | Hauser et al. . |
| 5,444,217 | 8/1995 | Moore et al. . |
| 5,444,815 | 8/1995 | Lee et al. . |
| 5,445,675 | 8/1995 | Kubodera et al. . |
| 5,446,824 | 8/1995 | Moslehi . |
| 5,446,825 | 8/1995 | Moslehi et al. . |
| 5,449,883 | 9/1995 | Tsuruta . |
| 5,451,260 | 9/1995 | Versteeg et al. . |
| 5,452,396 | 9/1995 | Sopori . |
| 5,478,609 | 12/1995 | Okamura . |
| 5,480,489 | 1/1996 | Hasegawa . |
| 5,481,088 | 1/1996 | Peck et al. . |
| 5,482,557 | 1/1996 | Kanai et al. . |
| 5,487,127 | 1/1996 | Gronet et al. . |
| 5,493,987 | 2/1996 | McDiarmid et al. . |
| 5,501,739 | 3/1996 | Yamada et al. . |
| 5,504,831 | 4/1996 | Sandhu et al. . |
| 5,505,779 | 4/1996 | Mizuno et al. . |
| 5,518,549 | 5/1996 | Hellwig . |
| 5,525,160 | 6/1996 | Tanaka et al. . |
| 5,534,072 | 7/1996 | Mizuno et al. . |
| 5,539,855 | 7/1996 | Takahashi et al. . |
| 5,551,982 | 9/1996 | Anderson et al. . |
| 5,551,985 | 9/1996 | Brors et al. . |
| 5,561,735 | 10/1996 | Camm . |
| 5,565,382 | 10/1996 | Tseng et al. . |
| 5,571,749 | 11/1996 | Matsuda et al. . |
| 5,576,059 | 11/1996 | Beinglass et al. . |
| 5,577,157 | 11/1996 | Sopori . |
| 5,587,019 | 12/1996 | Fujie . |
| 5,595,606 | 1/1997 | Fujikawa et al. . |
| 5,599,397 | 2/1997 | Anderson et al. . |
| 5,609,689 | 3/1997 | Kato et al. . |
| 5,611,898 | 3/1997 | Guhman et al. . |
| 5,624,499 | 4/1997 | Mizuno et al. . |
| 5,624,590 | 4/1997 | Fiory . |
| 5,635,409 | 6/1997 | Moslehi . |
| 5,683,173 | 11/1997 | Gronet et al. . |
| 5,689,614 | 11/1997 | Gronet et al. . |
| 5,937,142 * | 8/1999 | Moslehi et al. ............... 392/416 |
| 5,970,214 * | 10/1999 | Gat ................................. 392/416 |

\* cited by examiner

HEATING DEVICE CONTAINING A MULTI-LAMP CONE FOR HEATING SEMICONDUCTOR WAFERS

FIELD OF THE INVENTION

The present invention is generally directed to thermal processing chambers for heating semiconductor wafers using radiant energy. More particularly, the present invention is directed to improved heating lamp configurations for use in thermal processing chambers.

BACKGROUND OF THE INVENTION

A thermal processing chamber as used herein refers to a device that rapidly heats objects, such as semiconductor wafers. Such devices typically include a substrate holder for holding a semiconductor wafer and a source that emits light and heat energy for heating the wafer. During heat treatment, the semiconductor wafers are heated under controlled conditions according to a preset temperature regime. For monitoring the temperature of the semiconductor wafer during heat treatment, thermal processing chambers also typically include temperature sensing devices, such as pyrometers, that sense the radiation being emitted by the semiconductor wafer at a selected band of wavelengths. By sensing the thermal radiation being emitted by the wafer, the temperature of the wafer can be calculated with reasonable accuracy.

In alternative embodiments, instead of or in addition to using radiation sensing devices, thermal processing chambers can also contain thermocouples for monitoring the temperature of the wafers. Thermocouples measure the temperature of objects by direct contact.

Many semiconductor heating processes require a wafer to be heated to high temperatures so that various chemical and physical reactions can take place as the wafer is fabricated into a device. During rapid thermal processing, which is one type of processing, semiconductor wafers are typically heated by an array of lamps to temperatures, for instance, from about 400° C. to about 1,200° C., for times which are typically less than a few minutes. During these processes, one main goal is to heat the wafers as uniformly as possible.

Problems have been experienced in the past, however, in being able to maintain a constant temperature throughout the wafer and in being able to control the rate at which the wafer is heated. If the wafer is heated nonuniformly, various unwanted stresses can develop in the wafer. Not being able to heat the wafers uniformly also limits the ability to uniformly deposit films on the wafers, to uniformly etch the wafers, beside limiting the ability to perform various other chemical and physical processes on the wafers.

Temperature gradients can be created within the wafer due to various factors. For instance, due to the increased surface area to volume ratio, the edges of semiconductor wafers tend to have a cooling rate and a heating rate that are different than the center of the wafer. The energy absorption characteristics of wafers can also vary from location to location. Additionally, when gases are circulated in the chamber, the gases can create cooler areas on the wafer due to convection.

In the past, various lamp configurations have been proposed in order to overcome the above described deficiencies and improve the ability to heat wafers more uniformly and to control the temperature of the wafers at various locations. These systems, however, have become increasingly complex and expensive to produce. For instance, some systems can contain well over 100 lamps.

In view of the above, a need currently exists for an improved thermal processing chamber that is capable of uniformly heating semiconductor wafers. A need also exists for a thermal processing chamber containing an improved lamp heater configuration. Further, a need exists for an improved rapid thermal processing chamber for heating semiconductor wafers that is equipped with controls for varying the amount of energy that is applied to the wafer at different locations based upon the characteristics and properties of the wafer. Such controls are especially necessary due to the increasing demands that are being placed upon the preciseness at which the semiconductor wafers are heat treated and at which semiconductor devices are fabricated.

SUMMARY OF THE INVENTION

The present invention recognizes and addresses the foregoing disadvantages and others of prior art constructions and methods.

Accordingly, it is an object of the present invention to provide an improved thermal processing chamber for heat treating semiconductor wafers.

Another object of the present invention is to provide a thermal processing chamber having an improved lamp configuration for heating the wafers uniformly.

Still another object of the present invention is to provide a heating device for use in thermal processing chambers that contains a plurality of lamps which form overlapping heating zones on a wafer being heated.

Another object of the present invention is to provide a heating device for use in thermal processing chambers that contains at least one multi-lamp cone.

Still another object of the present invention is to provide a heating device for use in thermal processing chambers that contains a plurality of lamps surrounded by a conically-shaped reflector, wherein at least some of the lamps are tilted with respect to a semiconductor wafer being heated.

These and other objects of the present invention are achieved by providing an apparatus for heat treating semiconductor wafers. The apparatus includes a thermal processing chamber adapted to contain a semiconductor wafer. For instance, a substrate holder can be contained within the chamber upon which the wafer is held. A heating device is placed in communication with the thermal processing chamber which emits thermal light energy onto the wafer held on the substrate holder. The heating device can include an assembly of light energy sources which are positioned to preferentially heat different zones of the wafer.

During the heating process, either the semiconductor wafer is rotated or the light energy sources are rotated. In this manner, the light energy sources form radial heating zones on the wafer. In accordance with the present invention, the light energy sources are positioned so that most of the light energy sources are located at different radial locations with respect to one another. As such, many different radial heating zones are formed on the wafer which aid in heating the wafer uniformly and provide good temporal control during the heating cycle.

In accordance with the present invention, the heating device includes at least one heating cone having an axis that is perpendicular to a semiconductor wafer contained in the thermal processing chamber. The heating cone is designed to control the amount of electromagnetic energy being emitted by a group of lamps in a manner that more uniformly heats a semiconductor wafer. The heating cone includes a plurality of light energy sources positioned within a circular reflector.

For instance, in one preferred embodiment, the circular reflector is conically-shaped such that the reflector gradually increases or decreases in diameter in a direction towards the semiconductor wafer.

In one embodiment, the light energy sources contained within the conically-shaped reflector are arranged in a circular configuration. In most applications, it is better not to place a light energy source directly in the center of the conically-shaped reflector. Typically, at least six light energy sources are placed within the reflector. The light energy sources can be substantially vertically oriented or tilted with respect to the axis of the heating cone. For example, in one embodiment, some of the lamps can be vertically oriented while some of the lamps can be tilted towards the axis. In particular, some of the lamps can be tilted up to about 20 degrees with respect to the axis, and particularly in an amount from about 6 degrees to about 12 degrees.

Besides light energy sources, the heating cone of the present invention can further include a reflective top that encloses the conically-shaped reflector. The reflective top can be flat or can be dome shaped or can be cone shaped. Preferably, both the reflective top and the conically-shaped reflector are made from highly reflective materials. For instance, the top and the conically-shaped reflector can be made from a polished metal, such as gold, or from a highly reflective dielectric material. In one embodiment, the reflective top is designed to be more light diffusive than the conically-shaped reflector. For example, in one embodiment, the reflective top is at least 75% diffusive, while the conically-shaped reflector is less than 10% diffusive and particularly less than 5% diffusive.

In order to control the amount of light energy that is emitted by the heating device, the apparatus of the present invention can include at least one temperature sensing device which senses the temperature of the wafer at a plurality of locations. For instance, the temperature sensing device can be a plurality of pyrometers, one pyrometer with multiple viewing ports, or one or more thermocouples. The temperature sensing devices can be in communication with a controller, such as a microprocessor, which determines the temperature of the wafer. The controller, in turn, can be in communication with the power supply of the light energy sources for controlling the amount of heat being emitted by the light energy sources in response to the temperature of the wafer. The controller can be configured, for instance, to control the amount of light energy being emitted by each light energy source or can control different groups of the light energy sources.

Besides the light energy sources contained in the heating cone, the heating device of the present invention can include other light energy sources such as tungsten-halogen lamps surrounding the cone. For instance, in one embodiment, the heating cone can be placed at the center of the heating device and concentric rings of light energy sources can surround the heating cone. In order to maintain the lamps in position, the lamps can be connected to a mounting base that forms part of the heating device. The mounting base can include reflective devices for directing the light energy being emitted by the lamps onto the wafer. The reflective devices can be polished annular surfaces surrounding the lamps or, alternatively, can be in the shape of plates that extend adjacent to the lamps. For example, in one embodiment, the heating device includes reflective plates which extend beyond the length of the lamps in a direction perpendicular to the semiconductor wafer.

Other objects, features and aspects of the present invention are discussed in greater detail below.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures in which.

Repeat use of references characters in the present specification and drawings is intended to represent same or analogous features or elements of the invention.

DETAILED DESCRIPTION OF THE PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary construction.

In general, the present invention is directed to an apparatus and method for heating semiconductor wafers uniformly and at a controlled rate. The apparatus includes a thermal processing chamber in communication with a heating device that is used to heat treat semiconductor wafers contained in the chamber. The heating device contains a plurality of lamps that are positioned at preselected locations for heating the wafers.

More particularly, the present invention is directed to the use of a heating cone contained within the heating device that controls the electromagnetic energy being emitted from a subset of light energy sources. The heating cone includes a circular reflector, that in one embodiment, is conically-shaped having a diameter that decreases in a direction towards a wafer being heated. A group of light energy sources, such as at least six, are contained within the reflector. The light energy sources can be substantially vertically oriented and/or can be tilted towards the center of the heating cone. In this manner, the electromagnetic energy being emitted by the light energy sources contained within the reflector form a uniform irradiance distribution on a wafer being heated.

During heating, the wafer is rotated with respect to the plurality of lamps. In this manner, the lamps form radial heating zones on the wafer. In accordance with the present invention, the lamps are configured so that many different radial heating zones are formed. The energy supplied to each heating zone is then controlled for heating the wafer uniformly.

In one embodiment, the temperature at different locations of the wafer is monitored. Based upon the temperature sensed at the different locations, the energy being emitted by the lamps is selectively controlled for maintaining a constant temperature throughout the wafer.

Figure 1:
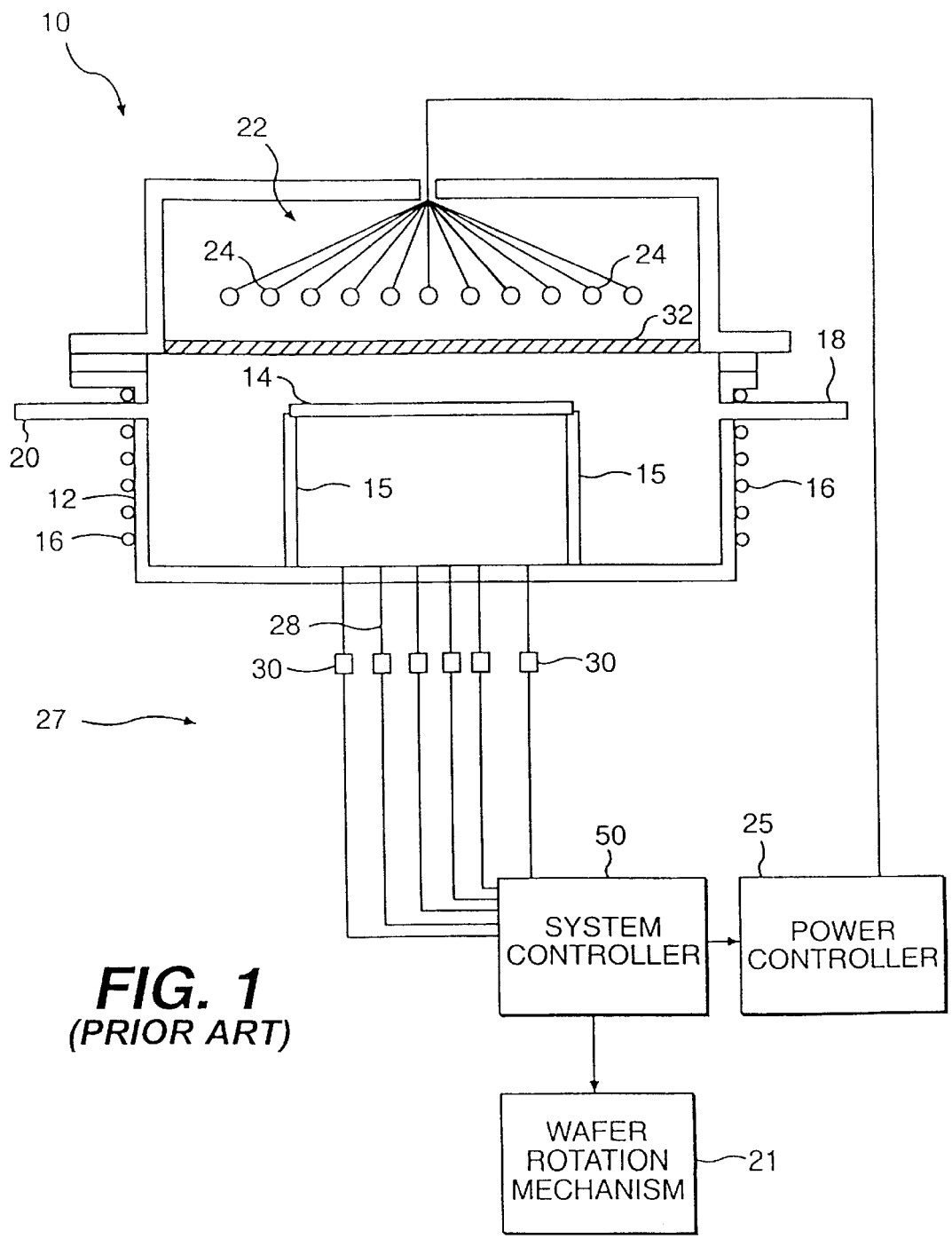
FIG. 1 is a cross-sectional, diagrammatical view of one embodiment of a thermal processing chamber.

Referring to FIG. 1, a system generally 10 made in accordance with the present invention for heat treating a wafer made from a semiconductive material, such as silicon, is illustrated. System 10 includes a processing chamber 12 adapted to receive substrates such as a wafer 14 for conducting various processes. As shown, wafer 14 is positioned on a substrate holder 15 made from a thermal insulating material such as quartz. Chamber 12 is designed to heat wafer 14 at very rapid rates and under carefully controlled conditions. Chamber 12 can be made from various materials, including metals and ceramics. For instance, chamber 12 can be made from stainless steel or quartz.

When chamber 12 is made from a heat conductive material, preferably the chamber includes a cooling system. For instance, as shown in FIG. 1, chamber 12 includes a cooling conduit 16 wrapped around the perimeter of the chamber. Conduit 16 is adapted to circulate a cooling fluid, such as water, which is used to maintain the walls of chamber 12 at a constant temperature.

Chamber 12 can also include a gas inlet 18 and a gas outlet 20 for introducing a gas into the chamber and/or for maintaining the chamber within a preset pressure range. For instance, a gas can be introduced into chamber 12 through gas inlet 18 for reaction with wafer 14. Once processed, the gas can then be evacuated from the chamber using gas outlet 20.

Alternatively, an inert gas can be fed to chamber 12 through gas inlet 18 for preventing any unwanted or undesirable side reactions from occurring within the chamber. In a further embodiment, gas inlet 18 and gas outlet 20 can be used to pressurize chamber 12. A vacuum can also be created in chamber 12 when desired, using gas outlet 20 or an additional larger outlet positioned beneath the level of the wafer.

During processing, substrate holder 15, in one embodiment, can be adapted to rotate wafer 14 using a wafer rotation mechanism 21. Rotating the wafer promotes greater temperature uniformity over the surface of the wafer and promotes enhanced contact between wafer 14 and any gases introduced into the chamber. It should be understood, however, that besides wafers, chamber 12 is also adapted to process optical parts, films, fibers, ribbons, and other substrates having any particular shape.

A heat source or heating device generally 22 is included in communication with chamber 12 for heating wafer 14 during processing. Heating device 22 includes a plurality of lamps 24, such as tungsten-halogen lamps. As shown in FIG. 1, lamps 24 are placed above wafer 14. It should be understood, however, that lamps 24 may be placed at any particular location. Further, additional lamps could be included within system 10 if desired.

The use of lamps 24 as a heat source is generally preferred. For instance, lamps have much higher heating and cooling rates than other heating devices, such as electrical elements or conventional furnaces. Lamps 24 create a rapid isothermal processing system that provides instantaneous energy, typically requiring a very short and well controlled start up period. The flow of energy from lamps 24 can also be abruptly stopped at any time. As shown in the figure, lamps 24 are equipped with a gradual power controller 25 that can be used to increase or decrease the electromagnetic energy being emitted by any of the lamps.

In order to monitor the temperature of wafer 14 during the heating process, in this embodiment, thermal processing chamber 12 includes plurality of radiation sensing devices generally 27. Radiation sensing devices 27 include a plurality of optical fibers or light pipes 28 which are, in turn, in communication with a plurality of corresponding light detectors 30. Optical fibers 28 are configured to receive thermal energy being emitted by wafer 14 at a particular wavelength. The amount of sensed radiation is then communicated to light detectors 30 which generate a usable voltage signal for determining the temperature of the wafer which can be calculated based, in part, on Planck's Law. In one embodiment, each optical fiber 28 in combination with a light detector 30 comprises a pyrometer. In another embodiment, the optical fibers, 28, are routed to a single but multiplexing radiation sensing device.

In general, thermal processing chamber 12 can contain one or a plurality of radiation sensing devices. In a preferred embodiment, as shown in FIG. 1, thermal processing chamber 12 contains a plurality of radiation sensing devices that measure the temperature of the wafer at different locations. Knowing the temperature of the wafer at different locations can then be used to control the amount of heat being applied to the wafer as will be described in more detail hereinafter. The amount of heat applied to various zones of the wafer can also be controlled in an open loop fashion. In this configuration the ratios between the various heating zones can be pre-determined after manual optimization. In subsequent processes, these ratios are used with no changes during the heating cycles.

During the process of the present invention, system 10 should be designed such that optical fibers 28 only detect thermal radiation being emitted by wafer 14 and not detect radiation being emitted by lamps 24. In this regard, system 10 includes a filter window 32 which prevents thermal radiation being emitted by lamps 24 at the wavelength at which light detectors 30 operate from entering chamber 12. Filter window 32 also serves to isolate lamps 24 from wafer 14 and prevent contamination of the chamber. Filter window 32 as shown in FIG. 1 can be a semitransparent plate positioned between chamber 12 and heat source 22. In an alternative embodiment, each lamp 24 can be covered by a separate filter.

In one embodiment, filter window 32 is made from fused silica or quartz. Fused silica is known to absorb thermal radiation very effectively at selected wavelengths. For instance, synthetic fused silica with high concentration of OH ions is very effective at absorbing light at a wavelength of from approximately 2.7 micrometers to about 2.8 micrometers. Thus, in one embodiment, when filter window 32 is made from synthetic fused silica, light detectors 30 can be configured to detect thermal radiation being emitted by wafer 14 at a wavelength of about 2.7 micrometers. In other embodiments, the separation between radiation arriving to the sensor from the wafer and lamps is achieved by mechanical means of isolation. In these embodiments, buffers and shields are present to prevent a direct path from forming between a light source and a sensing port.

Besides using radiation sensing devices, other temperature sensing devices may be used in the system of the present invention. For instance, one or more thermocouples may be incorporated into the system for monitoring the temperature of the wafer at a single location or at a plurality of locations. The thermocouples can be placed in direct contact with the wafer or can be placed adjacent the wafer from which the temperature can be extrapolated.

System 10 further includes a system controller 50 which can be, for instance, a microprocessor. Controller 50 receives voltage signals from light detectors 30 that represent the radiation amounts being sampled at the various locations. Based on the signals received, controller 50 is configured to calculate the temperature of wafer 14 at different locations.

System controller 50 as shown in FIG. 1 can also be in communication with lamp power controller 25. In this arrangement, controller 50 can determine the temperature of wafer 14, and, based on this information, control the amount of thermal energy being emitted by lamps 24. In this manner, instantaneous adjustments can be made regarding the conditions within reactor 12 for processing wafer 14 within carefully controlled limits.

In one embodiment, controller 50 can also be used to automatically control other elements within the system. For instance, controller 50 can be used to control the flow rate of gases entering chamber 12 through gas inlet 18. As shown, controller 50 can further be used to control the rate at which wafer 14 is rotated within the chamber.

Figure 2:
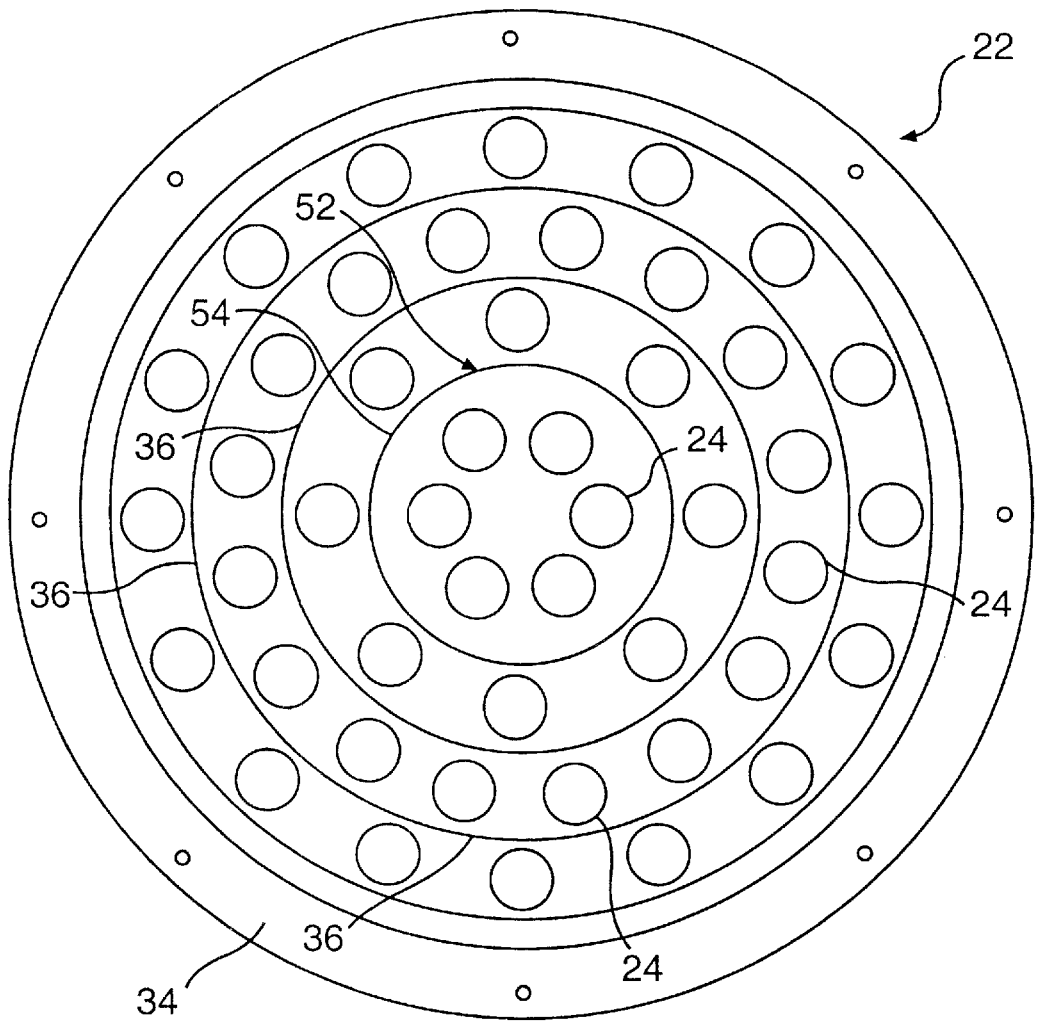
FIG. 2 is a plan view of one embodiment of a heating device that may be used in thermal processing chambers made in accordance with the present invention.

As described above, the present invention is generally directed to a particular heating configuration that is used within thermal processing chamber 12. Referring to FIG. 2, one embodiment of a heating device 22 that can be used in combination with thermal processing chamber 12 in accordance with the present invention is illustrated. As shown, heating device 22 includes a plurality of light energy sources, such as lamps 24 that are secured to a mounting base 34. In particular, in this embodiment, lamps 24 are arranged in concentric circles.

In accordance with the present invention, at the center of heating device 22 is a heating cone generally 52. Heating cone 52 is designed to direct electromagnetic energy being emitted by the center light energy sources 24 in a manner that forms a uniform irradiance distribution on a wafer being heated. For instance, in this embodiment, heating cone 52 is designed to uniformly heat the center of a wafer rotating below heating device 22.

Heating cone 52 includes a circular reflector 54 surrounding the center light energy sources 24. For most applications, at least six light energy sources are contained within the heating cone.

Figure 3:
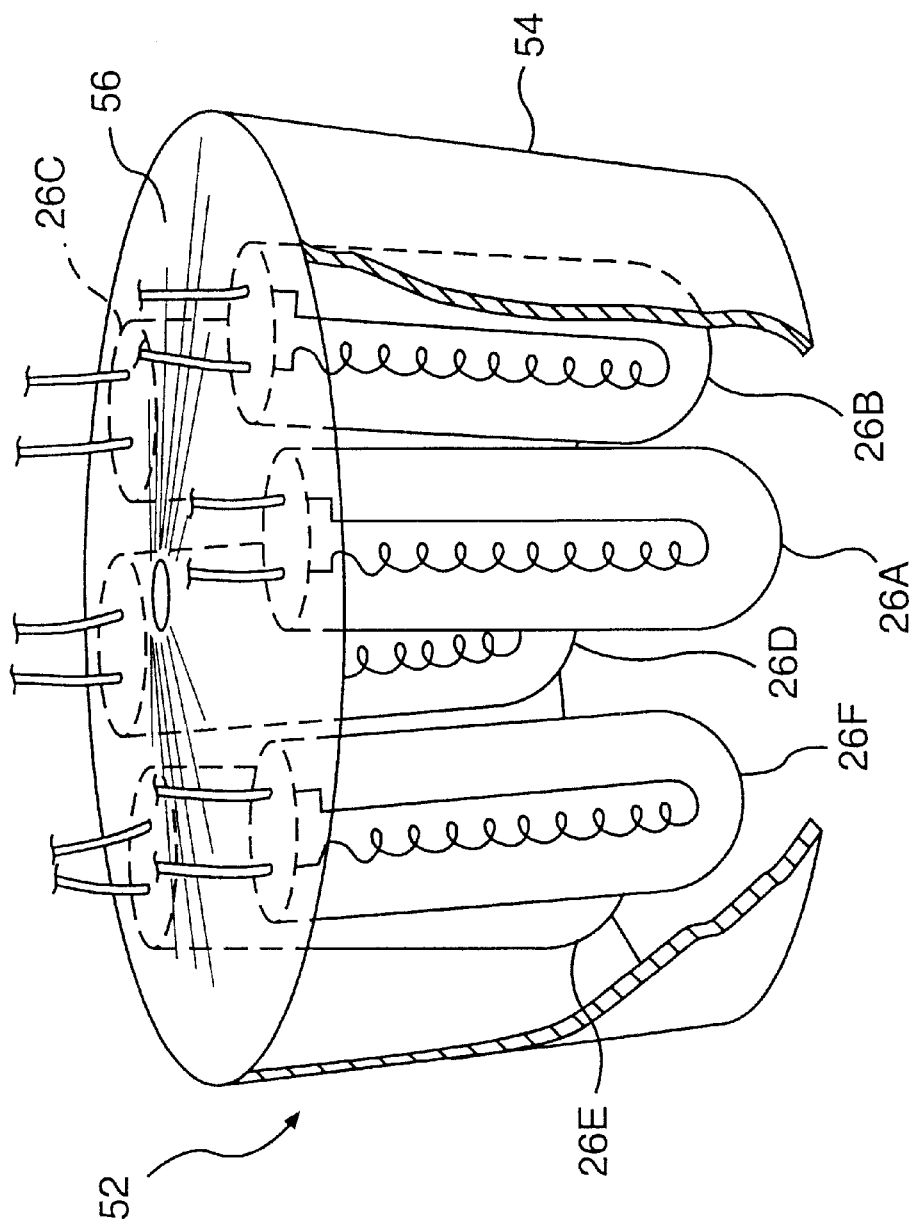
FIG. 3 is a cross-sectional view of one embodiment of a conically-shaped heating element that may be used in heating devices made in accordance with the present invention.

Referring to FIG. 3, a cross sectional view of heating cone 52 is illustrated. According to the present invention, circular reflector 54 can be substantially cylindrically-shaped, or, as shown in this embodiment, is preferably conically-shaped. In particular, reflector 54 has a diameter that gradually decreases towards a wafer being heated. For instance, the interior walls of reflector 54 can have a slope of up to 20 degrees, and particularly from about 6 degrees to about 12 degrees with respect to the central axis of the heating cone. Alternatively, reflector 54 can have a diameter that gradually increases towards a wafer in the chamber.

As described above, for most applications, heating cone 52 will contain at least six light energy sources 26. In the embodiment illustrated in FIG. 3, light energy sources 26A, 26B, 26C, 26D, 26E and 26F are illustrated. In general, the light energy sources can be vertically oriented with respect to the axis of the heating cone or can be tilted towards the axis. In one preferred embodiment, as shown in FIG. 3, some of the light energy sources are vertically oriented while some of the light energy sources are tilted.

Specifically, light energy sources 26A, 26C, and 26E are substantially vertically oriented. Light energy sources 26B, 26D and 26F, however, are tilted inwards towards the central axis of the cone. Similar to the slope of the walls of reflector 54, for most applications, the lamps can be tilted up to about 20 degrees, particularly from about 6 degrees to about 12 degrees, and, in one embodiment, can be tilted about 8 degrees.

As shown in FIG. 2, generally light energy sources 24 contained within heating cone 52 are positioned in a circle located around the periphery of the interior of the cone. A light energy source positioned within the center of the cone is generally not desired. In particular, the present inventor discovered that if a center lamp were provided in the heating cone, the lamp would sum poorly with the off axis lamps and form a nonuniform irradiance distribution on a wafer. The present inventor also discovered, however, that merely placing a circle of lamps in a cylindrical cone also did not produce a favorable irradiance distribution. In particular, this configuration created a cold zone on the wafer at a position directly beneath the center of the heating cone.

The present inventor has discovered that these deficiencies can be overcome by tilting the walls of the heating cone and/or tilting selected lamps contained within the cone. By forming a conically-shaped reflector and by tilting preselected lamps contained within the reflector, it was found that a uniform irradiance distribution could be formed on a wafer below the heating cone. In this configuration, a center lamp is not required and the resulting irradiance distribution does not form a cold zone in the center.

Referring to FIG. 3, besides conically-shaped reflector 54, heating cone 52 can further include a reflective top 56 to which the light energy sources are mounted. Reflective top 56 and conically-shaped reflector 54 should have a highly reflective surface. For instance, reflective top 56 and reflector 54 can be made from a polished metal, such as gold or from a highly reflective dielectric material.

Although reflective top 56 and conically-shaped reflector 54 should both be made from a highly reflective material, in one embodiment, the top and the walls of the heating cone can have different reflective characteristics which have been found to further promote the uniform distribution of electromagnetic energy being emitted by the heating cone. For instance, in one embodiment, reflective top 56 can be more light diffusive than conically-shaped reflector 54. In other words, top 56 can have a surface that highly scatters light, while the surface of reflector 54 can have a more mirror-like finish that does not significantly scatter light. For example, in one embodiment, reflective top 56 can be at least 75% light diffusive, while the interior surface of reflector 54 can be less than 10% light diffusive, and particularly less than 5% diffusive.

Referring back to FIG. 2, as shown in this embodiment, heating cone 52 is generally placed within the center of heating device 22 and is surrounded by concentric rings of light energy sources 24. Light energy sources 24 located outside of heating cone 52 can also be associated with a reflector or set of reflectors. Light energy sources 24 can be vertically oriented with respect to a wafer positioned within the chamber or can be tilted similar to the light energy sources contained within the heating cone.

For instance, mounting base 34 can include a reflective surface that surrounds the lamps. In one embodiment, reflective annular recesses can be formed into mounting base 34 for directing the light energy onto the wafer.

Alternatively or additionally, reflective plates 36 can also be attached to mounting base 34 and used in association with lamps 24. Reflective plates 36 can be positioned perpendicular to a wafer being heated and can extend a length shorter than lamps 24, can extend approximately the same length as lamps 24, or can extend beyond the length of lamps 24. In the embodiment illustrated in FIG. 2, reflective plates 36 form circular shaped channels on mounting base 34 in which lamps 24 are disposed. When present, reflective plates 36 serve to direct the light energy being emitted by lamps 24 onto desired locations on the wafer.

In order to heat a wafer uniformly with heating device 22 as shown in FIG. 2, controller 50 as shown in FIG. 1 can be configured to control the amount of light energy being emitted by each of the lamps 24 depending upon the radial location. More particularly, the light energy being emitted by lamps 24 can be controlled in response to the temperature of the wafer at different locations as may be monitored by light detectors 30.

Figure 4:
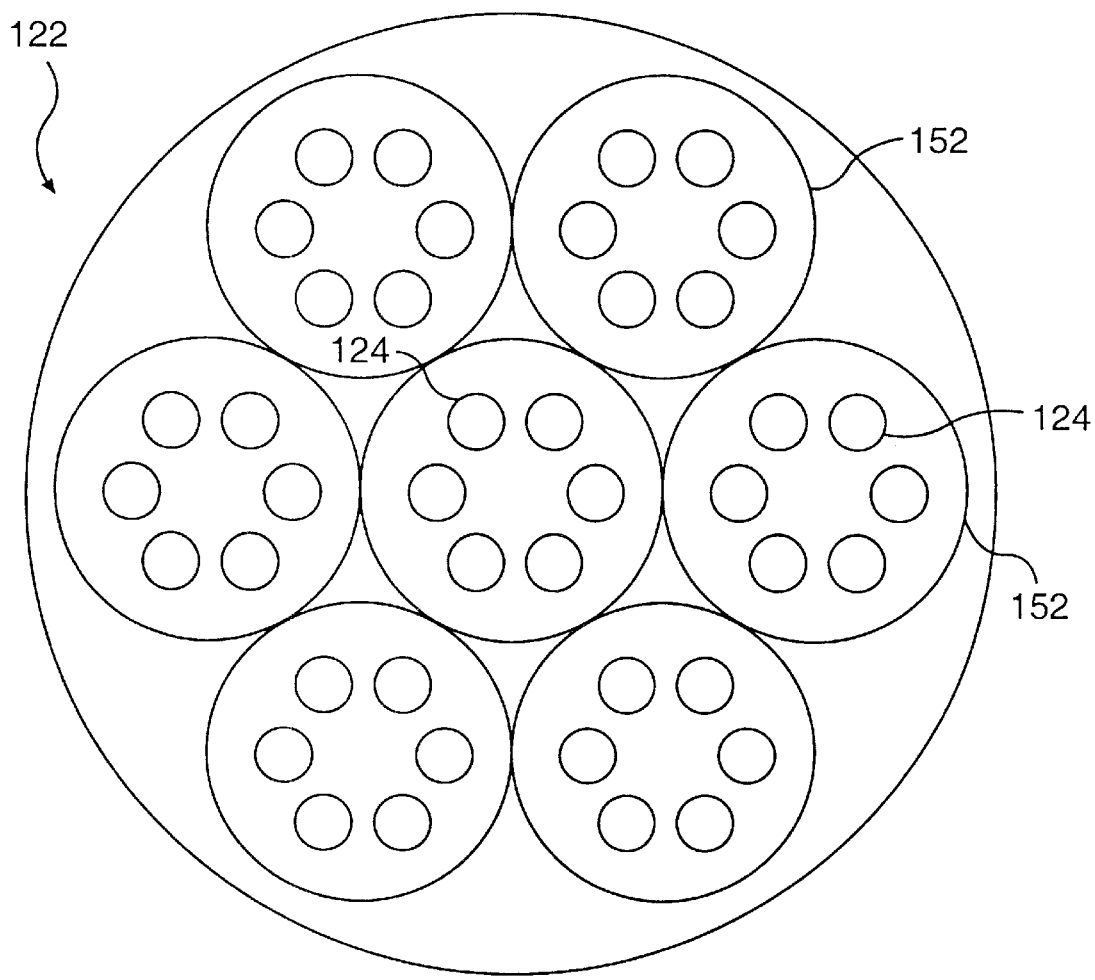
FIG. 4 is a plan view of a second alternative embodiment of a heating device that may be used in thermal processing chambers made in accordance with the present invention.

Besides containing only one heating cone as shown in FIG. 2, a heating device made in accordance with the present invention can also contain two or more of the heating cones. For instance, referring to FIG. 4, an alternative embodiment of a heating device generally 122 for use in thermal processing chamber 12 in accordance with the present invention is illustrated. As shown, in this embodiment, heating device 122 includes seven different heating cones 152 made in accordance with the present invention. Heating cones 152 can be constructed similar to the heating cone illustrated in FIG. 3.

In order to control the amount of electromagnetic energy being emitted by heating device 122, system controller 50 as shown in FIG. 1 can be configured to control light energy sources 124 based on temperature information received from the temperature sensing devices contained within the system. Preferably, controller 50 can control each heating cone 152 individually.

The present invention may be better understood with respect to the following example.

EXAMPLE

The following theoretical calculations were performed in order to demonstrate that a heating cone made in accordance with the present invention is well adapted to uniformly heating semiconductor wafers.

Figure 5:
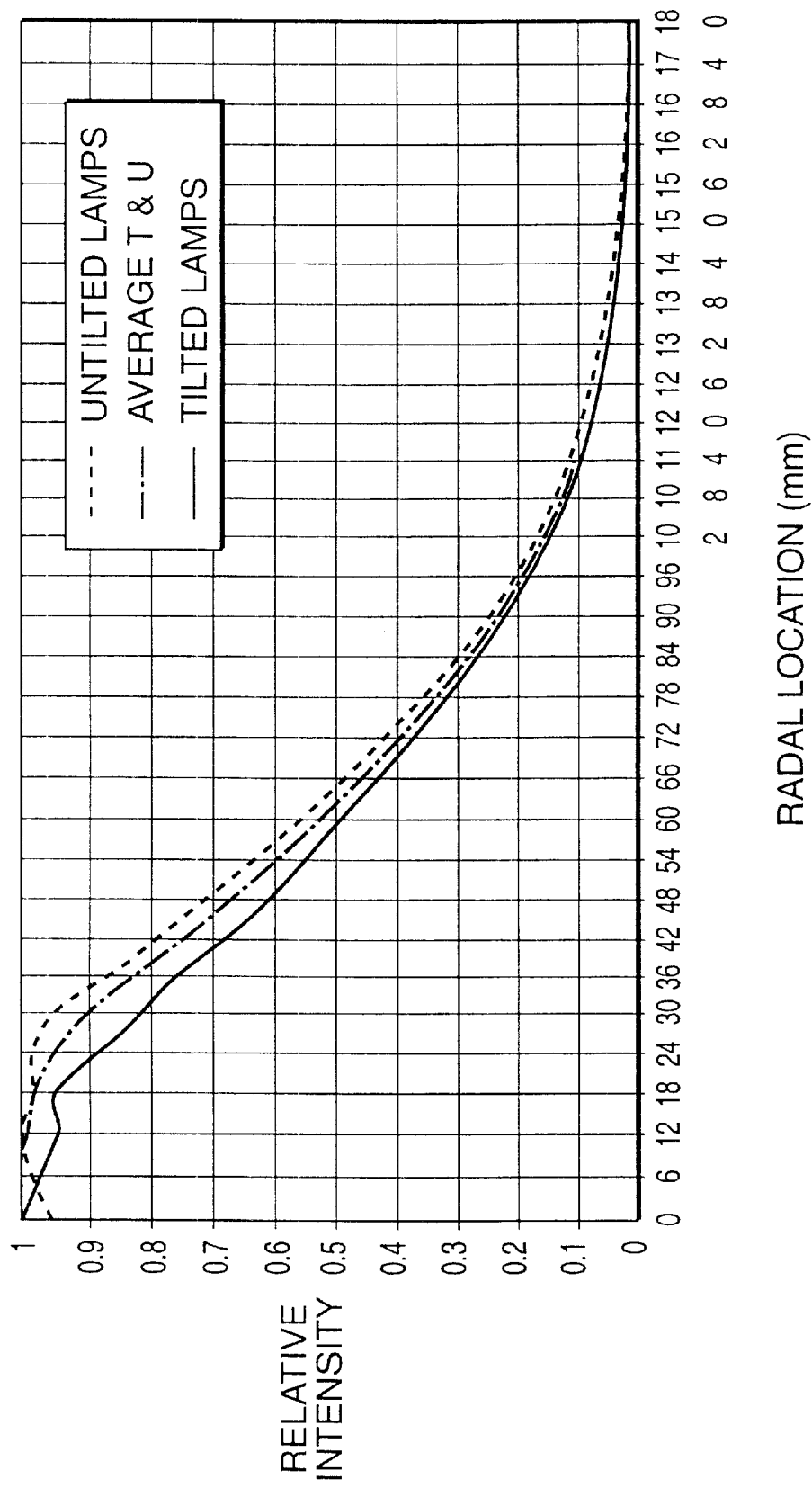
FIG. 5 is a graphical representation of the results obtained in example 1.

Specifically, in this example, the irradiance distribution of a heating cone having untilted lamps and a simple cylindrical reflector was compared with a heating cone made in accordance with the present invention having a conically-shaped reflector and containing six heating lamps, wherein three of the heating lamps have been tilted 8 degrees. FIG. 5 illustrates the results of the theoretical calculation. Specifically, FIG. 5 illustrates the radially averaged irradiance distributions corresponding to the different configurations.

As can be seen from the graph, the tilted cone design eliminates a cold location in the center of the irradiance distribution without requiring a center lamp. The distribution for the untilted lamps dips slightly in the center while the heating cone made in accordance with the present invention peaks somewhat in the center.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. An apparatus for heat treating semiconductor wafers comprising:
    a thermal processing chamber adapted to contain a semiconductor wafer, said thermal processing chamber containing at least one sidewall, an upper wall, and a lower wall;
    a heating device in communication with said thermal processing chamber for heating a semiconductor wafer contained in said chamber using electromagnetic energy, said heating device comprising at least one heating cone having an axis perpendicular to said semiconductor wafer, said heating cone including a plurality of light energy sources positioned within a conically-shaped reflector, said conically-shaped reflector gradually decreasing in diameter in a direction towards said semiconductor wafer; and
    a window separating said heating device from said thermal processing chamber, said window being disposed on either said upper wall or said lower wall of said thermal processing chamber.

2. An apparatus as defined in claim 1, wherein said plurality of light energy sources are arranged in a circular configuration within said conically-shaped reflector.

3. An apparatus as defined in claim 1, wherein at least six light energy sources are contained within said conically-shaped reflector.

4. An apparatus as defined in claim 1, wherein at least certain of said light energy sources positioned within said conically-shaped reflector are tilted towards said axis of said heating cone.

5. An apparatus as defined in claim 4, wherein said light energy sources are tilted up to about 20 degrees with respect to said axis.

6. An apparatus as defined in claim 4, wherein said light energy sources are tilted from about 6 degrees to about 12 degrees with respect to said axis.

7. An apparatus as defined in claim 4, wherein certain of said light energy sources are tilted and certain of said light energy sources are vertically oriented with respect to said axis of said heating cone.

8. An apparatus as defined in claim 1, wherein said diameter of said conically-shaped reflector has a slope of up to 20 degrees with respect to said axis of said heating cone.

9. An apparatus as defined in claim 8, wherein said slope is from about 6 degrees to about 12 degrees with respect to said axis.

10. An apparatus as defined in claim 1, wherein said heating device further comprises concentric rings of light energy sources surrounding said heating cone.

11. An apparatus as defined in claim 10, wherein at least certain of said light energy sources positioned within said conically-shaped reflector are tilted towards said axis of said heating cone.

12. An apparatus as defined in claim 1, wherein said heating device includes at least two heating cones.

13. An apparatus as defined in claim 1, wherein said heating cone further comprises a reflective top enclosing said conically-shaped reflector.

14. An apparatus as defined in claim 13, wherein said reflective top is more light diffusive than said conically-shaped reflector.

15. An apparatus as defined in claim 13, wherein at least certain of said light energy sources positioned within said conically-shaped reflector are tilted towards said axis of said heating cone.

16. An apparatus as defined in claim 1, further comprising:
    at least one temperature sensing device for sensing the temperature of said semiconductor wafer at least at one location; and
    a controller in communication with said at least one temperature sensing device and at least certain of said light energy sources, said controller being configured to control the amount of electromagnetic energy being emitted by said light energy sources in response to temperature information received from said at least one temperature sensing device.

17. An apparatus as defined in claim 16, wherein said controller is configured to control the amount of electromagnetic energy being emitted by said light energy sources contained in said heating cone independent of other light energy sources included in said heating device.

18. An apparatus as defined in claim 1, further comprising a substrate holder for holding said semiconductor wafer, said substrate holder being configured to rotate said wafer.

19. An apparatus for heat treating semiconductor wafers comprising:
   a thermal processing chamber, said thermal processing chamber containing at least one sidewall, an upper wall, and a lower wall;
   a substrate holder contained in said thermal processing chamber for holding a semiconductor wafer, said substrate holder being configured to rotate said wafer;
   a heating device in communication with said thermal processing chamber for heating a semiconductor wafer held on said substrate holder using electromagnetic energy, said heating device comprising at least one heating cone having an axis perpendicular to said semiconductor wafer, said heating cone including a plurality of light energy sources positioned within a circular reflector, wherein at least certain of said light energy sources positioned within said circular reflector are tilted towards said axis of said heating cone, said light energy sources being tilted in an amount up to about 20 degrees with respect to said axis; and
   a window separating said heating device from said thermal processing chamber, said window being disposed on either said upper wall or said lower wall of said thermal processing chamber.

20. An apparatus as described in claim 19, wherein some of said light energy sources are tilted and some of said light energy sources are vertically oriented with respect to said axis.

21. An apparatus as defined in claim 19, wherein said circular reflector is conically-shaped such that said reflector gradually increases or decreases in diameter in a direction towards said semiconductor wafer.

22. An apparatus as defined in claim 21, wherein said heating cone further includes a reflective top enclosing said circular reflector.

23. An apparatus as defined in claim 22, wherein said reflective top is dome-shaped.

24. An apparatus as defined in claim 22, wherein said reflective top is more light diffusive than said circular reflector.

25. An apparatus as defined in claim 24, wherein said reflective top is at least 75% light diffusive and said circular reflector is less than 10% light diffusive.

26. An apparatus as defined in claim 22, wherein said reflective top is cone-shaped.

27. An apparatus as defined in claim 19, wherein said circular reflector is conically-shaped such that said reflector gradually increases in diameter in a direction towards the semiconductor wafer.

28. An apparatus as defined in claim 19, wherein said light energy sources are tilted from about 6 degrees to about 12 degrees toward said axis.

29. An apparatus as defined in claim 19, wherein said circular reflector is gold plated.

30. An apparatus for heat treating semiconductor wafers comprising:
   a thermal processing chamber, said thermal processing containing at least one sidewall, an upper wall, and a lower wall;
   a substrate holder contained in said thermal processing chamber for holding a semiconductor wafer, said substrate holder being configured to rotate said wafer;
   a heating device in communication with said thermal processing chamber for heating a semiconductor wafer held on said substrate holder using electromagnetic energy, said heating device comprising at least one heating cone and having an axis perpendicular to said semiconductor wafer, said heating cone including a plurality of light energy sources positioned within a conically-shaped reflector, said conically-shaped reflector gradually decreasing in diameter in a direction towards said semiconductor wafer, at least certain of said light energy sources contained within said conically-shaped reflector being tilted towards said axis defined by said heating cone an amount up to about 20 degrees;
   a window separating said heating device from said thermal processing chamber, said window being disposed on either said upper wall or said lower wall of said thermal processing chamber;
   at least one temperature sensing device for sensing the temperature of said wafer at least at one location; and
   a controller in communication with said at least one temperature sensing device and said light energy sources, said controller being configured to control the amount of electromagnetic energy being emitted by said light energy sources in response to temperature information received from said at least one temperature sensing device.

31. An apparatus as defined in claim 30, wherein said light energy sources have a determined length and wherein said conically-shaped reflector extends beyond the length of said light energy sources.

32. An apparatus as defined in claim 30, wherein said heating device further comprises concentric rings of light energy sources surrounding said heating cone.

33. An apparatus as defined in claim 30, wherein at least six light energy sources are contained within said conically-shaped reflector.

34. An apparatus as defined in claim 30, further comprising a reflective top enclosing said conically-shaped reflector.

* * * * *